(12) United States Patent
Kowalsky

(10) Patent No.: US 12,412,801 B2
(45) Date of Patent: Sep. 9, 2025

(54) PACKAGED SEMICONDUCTOR DEVICE

(71) Applicant: 3-5 Power Electronics GmbH, Dresden (DE)

(72) Inventor: Jens Kowalsky, Storkow (DE)

(73) Assignee: 3-5 Power Electronics GmbH, Dresden (DE)

( * ) Notice: Subject to any disclaimer, the term of this patent is extended or adjusted under 35 U.S.C. 154(b) by 573 days.

(21) Appl. No.: 17/721,000

(22) Filed: Apr. 14, 2022

(65) Prior Publication Data

US 2022/0336315 A1 Oct. 20, 2022

(30) Foreign Application Priority Data

Apr. 15, 2021 (DE) ...................... 10 2021 001 968.7

(51) Int. Cl.
*H01L 23/367* (2006.01)
*H01L 23/31* (2006.01)
*H01L 23/46* (2006.01)
*H01L 23/49* (2006.01)

(52) U.S. Cl.
CPC ........ *H01L 23/367* (2013.01); *H01L 23/3107* (2013.01); *H01L 23/46* (2013.01); *H01L 23/49* (2013.01)

(58) Field of Classification Search
None
See application file for complete search history.

(56) References Cited

U.S. PATENT DOCUMENTS

| | | | | |
|---|---|---|---|---|
| 8,881,794 B2 * | 11/2014 | Walsh | ................... | F04D 29/582 |
| | | | | 165/104.34 |
| 8,890,313 B2 * | 11/2014 | Stella | ................ | H01L 23/49575 |
| | | | | 257/713 |
| 9,536,806 B2 | 1/2017 | Ebert et al. | | |

FOREIGN PATENT DOCUMENTS

| | | |
|---|---|---|
| DE | 10345419 A1 | 4/2005 |
| EP | 0901166 A1 | 3/1999 |
| EP | 2061078 A1 | 5/2009 |
| JP | 2002270748 A | 9/2002 |
| WO | WO2015086184 A1 | 6/2015 |

* cited by examiner

*Primary Examiner* — Dale E Page
*Assistant Examiner* — Patrick Cullen
(74) *Attorney, Agent, or Firm* — Muncy, Geissler, Olds & Lowe, P.C.

(57) ABSTRACT

Packaged semiconductor device having a heat sink, wherein the heat sink has a top, a bottom, lateral surfaces that connect the top to the bottom, and, extending within the heat sink, a cooling structure with an inlet line as well as an outlet line for a cooling medium, and is composed of an electrically conductive material with a first coefficient of thermal expansion at the top and with a second coefficient of thermal expansion at the bottom, a die is arranged on each of the top and the bottom of the heat sink and is connected to the heat sink in an electrically conductive manner, the coefficients of thermal expansion of the top and of the bottom of the heat sink correspond in each case to the coefficient of thermal expansion of the die arranged thereon or differ from the coefficient of thermal expansion of the die arranged thereon by at most 10% or by at most 20%.

18 Claims, 2 Drawing Sheets

PACKAGED SEMICONDUCTOR DEVICE

This nonprovisional application claims priority under 35 U.S.C. § 119(a) to German Patent Application No. 10 2021 001 968.7, which was filed in Germany on Apr. 15, 2021, and which is herein incorporated by reference.

BACKGROUND OF THE INVENTION

Field of the Invention

The present invention relates to a packaged semiconductor device having a heat sink and at least one die.

Description of the Background Art

Packaged semiconductor devices, disclosed in DE 103 45 419 A1, for example, are known to the person skilled in the art.

The person skilled in the art is also familiar with the circumstance that cooling of the semiconductor devices is necessary, especially in the field of power electronics. For example, a heat sink arrangement for a semiconductor component is known from EP 2 061 078 A1, which corresponds to US 2010/0175853, wherein the heat sink has a mounting surface with a coefficient of thermal expansion matched to the semiconductor component. A heat sink arrangement is also known from WO 2015 086 184 A1.

SUMMARY OF THE INVENTION

It is therefore an object of the present invention to provide a device that advances the state of the art. In particular, an especially compact construction is proposed that simultaneously also reduces mechanical stresses on the semiconductor components.

In an exemplary embodiment of the invention, a packaged semiconductor device with a heat sink is provided, wherein the heat sink has a top, a bottom, lateral surfaces that connect the top to the bottom, and, extending within the heat sink, a cooling structure with an inlet line as well as an outlet line for a cooling medium, and is composed of an electrically conductive material with a first coefficient of thermal expansion at the top and with a second coefficient of thermal expansion at the bottom.

A die is arranged on each of the top and/or the bottom of the heat sink and is connected to the heat sink in an electrically conductive manner. The coefficient of thermal expansion of the top and of the bottom of the heat sink corresponds in each case to the coefficient of thermal expansion of the die arranged thereon. It should be noted that the term "corresponds" encompasses a difference between the two coefficients of expansion of less than 5% or less than 8%.

The two coefficients of expansion can be exactly equal in value.

The coefficient of expansion on the bottom or on the top of the heat sink can be exactly equal to the coefficient of expansion of the respective die.

Preferably, the coefficient of thermal expansion of the top and of the bottom of the heat sink differs from the coefficient of thermal expansion of the die arranged thereon by at most 10% or by at most 20%.

The heat sink can be attached at one of the lateral surfaces to an electrically insulating carrier, wherein two electrically conductive terminal pins are attached to the carrier, and the heat sink with the dies and a part of the terminal pins are surrounded by an encapsulating material. It is a matter of course that the two terminal pins are electrically insulated from one another.

It should be noted that, in an improvement, the heat sink has a block-shaped design. Preferably, the top and the bottom have a quadrilateral, preferably a square or rectangular, design.

The surfaces of the heat sink at the top and at the bottom can be equal in size or different in size. In this case the surface at the top is larger than the surface at the bottom or the surface at the bottom is larger than the surface at the top. Preferably, the surface at the top and the surface at the bottom are each designed to be flat as a whole and/or parallel to one another.

The lateral surfaces of the heat sink can have a quadrilateral design, preferably a rectangular or a square design. In an improvement, two at a time of the total of four lateral surfaces are formed opposite one another. In an example, all four lateral surfaces are equal in size or different in size or at least the two opposite lateral surfaces in each case are designed to be equal in size or different in size.

All four lateral surfaces or at least two or three of the lateral surfaces can each be made to be flat as a whole. In an improvement, the lateral surfaces are designed to be parallel to one another in pairs in each case.

The size of the lateral surfaces can be designed to be smaller in each case than the size of the top or the size of the bottom. Preferably, the size of the lateral surface is in a range between 80% and 10% or in a range between 50% and 20% of the size of the surface at the top or the surface at the bottom.

It is a matter of course that exactly one, which is to say only one, of the lateral surfaces is integrally connected to the electrically insulating carrier. Preferably, the entire lateral surface of the heat sink is connected to the carrier.

Both the inlet line and the outlet line can be formed or flange-mounted on the lateral surface of the heat sink, which is parallel to a lateral surface connected to the heat sink.

The carrier can be designed to be block-shaped, preferably cuboid, wherein the carrier has two covering surfaces and four lateral surfaces. The two covering surfaces of the carrier are arranged parallel to one another and preferably are designed to be equal in size. The two covering surfaces of the carrier have a larger surface in each case than each of the lateral surfaces. Exactly one of the two covering surfaces of the carrier is connected to one of the lateral surfaces of the heat sink.

The covering surface of the carrier connected to the lateral surface of the heat sink can be designed to be equal in size to a first approximation or exactly equal in size. The covering surface connected to the heat sink can be larger than the lateral surface. Preferably, the covering surface has an area between 100% and 180% of the lateral surface of the heat sink.

An unpackaged integrated circuit on a semiconductor substrate, which is to say a diesd wafer section, i.e., a part of a semiconductor wafer with an integrated circuit, is referred to as a die.

It is a matter of course that the bottoms of the dies, which is to say the rear terminals, are at the same potential and, in particular, are connected in an electrically conductive manner, since the die bottoms are each conductively connected to a surface of the same heat sink, for instance by means of a soldered, press-fit, or sintered connection or any other contact technology.

The terminal contacts of the dies are wired to the terminal pins, wherein the electrical wiring of the terminal contacts of the dies, which is to say in particular of the heat sink for the rear contact and of the front contacts, to the terminal pins is accomplished by means of, for example, bond wires; pressing device or by means of ribbon-like structures, such as copper ribbons (copper ribbon bonding), or other connection technologies, wherein the connecting wires or ribbons pass over the carrier and are surrounded by the encapsulating material. Alternatively, one connection or multiple connections can also be routed through the carrier.

The front contacts of the two dies can be electrically wired to one another, wherein preferably each of the two front contacts is connected through the carrier to the same terminal pin by means of its own bond. The other terminal pin is wired to the heat sink through the carrier with a separate bond and thereby to the two rear contacts of the two dies. In this way, the two dies are electrically wired in parallel.

The two rear sides of the dies are electrically connected by means of the cooling structure, which is to say by means of the inlet line and/or the outlet line, wherein each top of the two dies is wired to a terminal pin over the carrier by means of a bond in each case. In other words, the tops of the two dies are electrically wired to different terminal pins.

An advantage of the semiconductor device is that it does not need a lead frame. In other words, the die is placed directly on the heat sink. In addition, the structure permits the manufacture of very compact and powerful semiconductor devices, since mechanical stresses, in particular, on the dies are avoided and effective cooling is achieved. In this way, the yield and the reliability of the construction are increased, and costs are reduced.

The two dies can have the same coefficient of thermal expansion. For example, they are components made of the same material or a similar material, such as GaAs. In an improvement, the dies are of the same kind, for example they are diodes of the same kind. "Of the same kind" means that they are essentially the same components, which is to say components made of the same material and with the same structure, wherein deviations caused by or related to production are still referred to as of the same kind.

The two dies can have coefficients of thermal expansion that differ from one another. For example, the dies are composed of different materials or different material compositions and/or they are different components, such as a diode on the one hand and an IGBT on the other hand or another customary combination of semiconductor components.

At least the two dies can each be implemented as diodes. Preferably, the two dies have the same typical electrical data.

The coefficient of thermal expansion of the heat sink can change from the bottom to the top, wherein the change takes place continuously or stepwise with at least one step.

The change in the coefficient of thermal expansion can be achieved, for example, by a change in the material composition of the heat sink. For example, the proportion of one material component is reduced and/or the proportion of another material component is increased. In particular, the stoichiometry is changed.

The semiconductor device can have at least one additional heat sink.

The additional heat sink can have a top, a bottom, lateral surfaces that connect the top to the bottom, and, extending within the heat sink, a cooling structure with an inlet line as well as an outlet line for a cooling medium.

The additional heat sink comprises or is composed of an electrically conductive material with a third coefficient of thermal expansion at the top and with a fourth coefficient of thermal expansion at the bottom. In an improvement, the two coefficients of expansion are exactly equal in value.

A die can be arranged on each of the top and the bottom of the additional heat sink and is connected to the additional heat sink in an electrically conductive manner.

The coefficients of thermal expansion of the top and of the bottom, which is to say the third and the fourth coefficients of expansion of the additional heat sink, correspond in each case to the coefficient of thermal expansion of the die arranged thereon.

It should be noted that the term "corresponds" can encompass a difference between the two coefficients of expansion of less than 5% or less than 8%.

The coefficient of expansion on the top or on the bottom of the heat sink is, which is to say the third coefficient of expansion and the fourth coefficient of expansion can be exactly equal to the coefficient of expansion of the respective die.

The third coefficient of expansion and the fourth coefficient of expansion can differ from the coefficient of thermal expansion of the relevant die arranged thereon by at most 10% or by at most 20%.

The additional heat sink can be attached at one of the lateral surfaces to the electrically insulating carrier at a distance from the first heat sink.

At least two additional terminal pins can be attached to the carrier, and the additional heat sink with the dies arranged thereon and a part of the additional terminal pins are surrounded by the encapsulating material.

The semiconductor body consequently can have two or more heat sinks, wherein the heat sinks are all mounted so as to be spaced apart from one another on the common carrier. The terminal pins for wiring are also mounted on the carrier.

It is a matter of course that the terminal pins also are each arranged so as to be spaced apart from one another as well as from the heat sinks. For example, the at least two heat sinks are lined up at intervals on one side of an elongated carrier, while the terminal pins are likewise lined up at intervals on an opposite side of the carrier.

The structure according to the invention with four dies, arranged on two heat sinks, permits, for example, an especially compact and robust implementation of a full-bridge rectifier or of integrated circuits with sensors.

It is a matter of course in the case of a rectifier that all dies are implemented to the greatest extent possible as the same kind of diodes or thyristors, GTOs, and the DC voltage is tapped through the two heat sinks.

The encapsulating material surrounds the heat sinks, the dies, and at least a part of the terminal pins and of the carrier. If appropriate, the encapsulating material also surrounds a part of the inlet line and outlet line. Preferably, the encapsulating material also surrounds, in particular, all bond wires, copper ribbons, etc., for wiring the dies to the pins.

At least one die can be a diode. In an example with two heat sinks, all dies are preferably diodes, so that a full-bridge rectifier can be realized by means of suitable wiring of the diodes or terminal pins or heat sinks. It is a matter of course that other components, in particular integrated circuits, can also be arranged on the heat sinks. In particular, diodes with other passive components can be arranged thereon.

At least one die can be an IGBT. Preferably, the die arranged on the top is implemented as a diode and the die arranged on the bottom is implemented as an IGBT, for example. It is a matter of course that other components, in particular integrated circuits, can also be arranged on the heat sinks.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
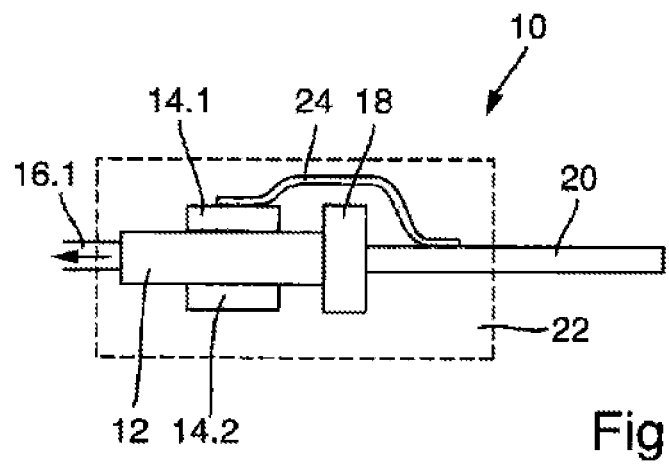
FIG. 1 is a side view of an example of a packaged semiconductor device.

The illustration in FIG. 1 shows a side view of a packaged semiconductor device 10 with a heat sink 12 composed of an electrically conductive material and two dies 14.1 and 14.2. The first die 14.1 is arranged directly on a top of the heat sink 12, while the second die 14.2 is arranged directly on a bottom of the heat sink 12 opposite the top.

The two dies 14 are each connected at a bottom to the heat sink 12 in an electrically conductive manner, wherein the heat sink is composed of an electrically conductive material. The bottoms of the dies are thus at the same potential, e.g., a ground potential.

The heat sink 12 also has a coefficient of thermal expansion at the top and at the bottom, wherein the coefficient of thermal expansion corresponds in each case to the coefficient of thermal expansion of the adjacent die or equal thereto or has a difference less than 10% or than 20%.

A cooling structure within the heat sink 12 is connected to at least one inlet line and at least one outlet line 16 for a coolant.

The heat sink 12 is arranged with a lateral surface on a carrier 18 made of an electrically insulating material. Arranged on a side of the carrier 18 facing away from the heat sink 12 are two terminal pins 20, wherein the heat sink 12 is wired to one of the terminal pins 20, while a top terminal contact of each die 14.1 and 14.2 is wired in each case to the other terminal pin 20, for example by means of a bond wire or a metal ribbon. In the illustration in FIG. 1, for the sake of clarity, only one connecting wire 24 is shown by way of example for the top terminal contact of the die 14.1. It is a matter of course that the top terminal contact of the die 14.2 is also wired to a terminal pin by means of an electrically conductive connection.

An encapsulating material 22 surrounds the heat sink 12, the dies 14.1, 14.2, the carrier 18, as well as a part of each of the inlet line and outlet line 16 and a part of each terminal pin 20 adjoining the carrier.

Figure 2:
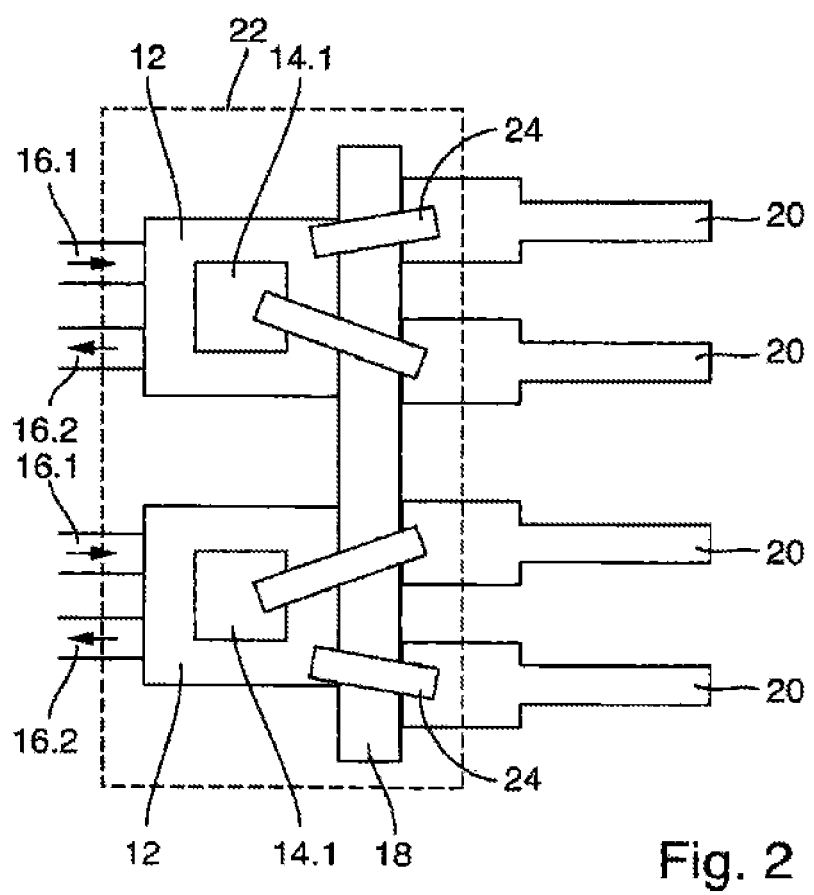
FIG. 2 is a view of an additional example of the packaged semiconductor device.

In the illustration in FIG. 2, another example is shown. Only the differences from the illustration in FIG. 1 are explained below.

The semiconductor device 10 comprises two heat sinks 12.1 and 12.2, which are arranged on the carrier 18 so as to be spaced apart from one another, wherein a die is arranged on each heat sink top and each heat sink bottom, and the respective side or surface of the heat sink 12.1 or 12.2 has the same coefficient of thermal expansion as the die arranged thereon. In addition, four terminal pins 20 are arranged on the carrier 12.

A first example of a wiring of the heat sinks or bottom contacts of the dies as well as of the top contacts of the dies to the terminal pins 20 by means of copper ribbons 24 is depicted in the illustration in FIG. 2. It is a matter of course that the wiring structure and type is determined by the dies and the application.

Each heat sink has its own inlet line and outlet line, so that the coolant flow runs more or less in parallel.

Figure 3:
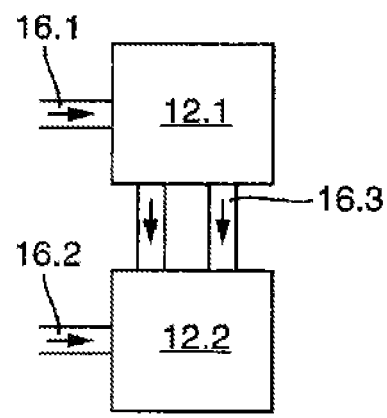
FIG. 3 is a view of two heat sinks in an additional example.

In the illustration in FIG. 3, another example of the coolant routing is shown schematically.

Alternatively, one of the heat sinks 12.1 has the inlet line 16.1, and the other heat sink 12.2 has the outlet line 16.2, wherein the coolant travels from the one heat sink 12.1 to the other heat sink 12.2 through at least one connecting line 16.3. The connecting lines 16.3 can be composed of an electrically insulating material.

Figure 4:
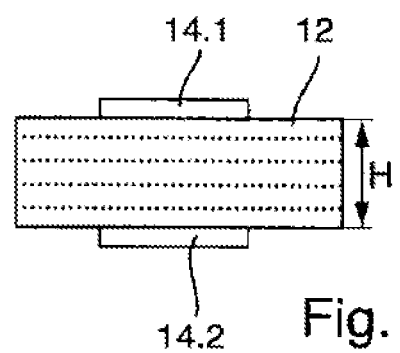
FIG. 4 is a view of a heat sink in an additional example.

In the illustration in FIG. 4, another example of the heat sink 12 is shown, where only the differences from the illustration in FIG. 1 are explained below.

Arranged on the top of the heat sink 12 is a first die 14.1, for example a diode, with a first coefficient of thermal expansion. Arranged on the bottom of the heat sink 12 is a second die 14.2 with a second coefficient of thermal expansion that differs from the first coefficient of thermal expansion.

A transition from the second coefficient of thermal expansion at the bottom of the heat sink 12 to the first coefficient of thermal expansion at the top of the heat sink 12 takes place in steps along a height H of the heat sink, so that the heat sink has multiple layers, each with a different coefficient of thermal expansion.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A packaged semiconductor device comprising:
   a heat sink having a top, a bottom, lateral surfaces that connect the top to the bottom, and, extending within the heat sink, a cooling structure with an inlet line and an outlet line for a cooling medium, the heat sink being formed of an electrically conductive material with a first coefficient of thermal expansion at the top and with a second coefficient of thermal expansion at the bottom; and
   a first die arranged on the top of the heat sink;
   a second die arranged on the bottom of the heat sink, the first and second die being connected to the heat sink in an electrically conductive manner,
   wherein the coefficient of thermal expansion of the top and of the bottom of the heat sink corresponds to the coefficient of thermal expansion of the die arranged thereon or differs from the coefficient of thermal expansion of the die arranged thereon by at most 10% or by at most 20%,
   wherein the heat sink is attached at one of the lateral surfaces to an electrically insulating carrier, wherein two terminal pins are attached to the electrically insulating carrier; and wherein the heat sink with the first and second die and a part of the terminal pins are surrounded by an encapsulating material.

2. The packaged semiconductor device according to claim 1, wherein the first and second die have a same coefficient of thermal expansion.

3. The packaged semiconductor device according to claim 1, wherein the first and second die have coefficients of thermal expansion that differ from one another.

4. The packaged semiconductor device according to claim 3, wherein the coefficient of thermal expansion of the heat sink changes from the bottom to the top, and wherein the change takes place continuously or stepwise with at least one step.

5. The packaged semiconductor device according to claim 1, wherein the semiconductor device has at least one additional heat sink, wherein the additional heat sink has a top, a bottom, lateral surfaces that connect the top to the bottom, and, extending within the heat sink, a cooling structure with an inlet line as well as an outlet line for a cooling medium, and is formed of an electrically conductive material with a third coefficient of thermal expansion at the top and with a fourth coefficient of thermal expansion at the bottom, wherein a third die and a fourth die are arranged on the top and the bottom of the additional heat sink and is connected to the additional heat sink in an electrically conductive manner, wherein the coefficient of thermal expansion of the top and of the bottom of the additional heat sink correspond in each case to the coefficient of thermal expansion of the die arranged thereon or differ from the coefficient of thermal expansion of the die arranged thereon by at most 10% or by at most 20%, wherein the additional heat sink is attached at one of the lateral surfaces to the electrically insulating carrier at a distance from the first heat sink, wherein at least two additional terminal pins are attached to the carrier, and wherein the additional heat sink with the fourth and fifth die arranged thereon and a part of the additional terminal pins are surrounded by the encapsulating material.

6. The packaged semiconductor device according to claim 1, wherein at least one die is a diode.

7. The packaged semiconductor device according to claim 1, wherein at least one die is an IGBT.

8. The packaged semiconductor device according to claim 1, wherein at least the first and second die are diodes.

9. The packaged semiconductor device according to claim 1, wherein at least the first and second die are wired in parallel.

10. The packaged semiconductor device according to claim 1, wherein exactly one of the lateral surfaces of the heat sink is integrally connected to a covering surface of the carrier.

11. The packaged semiconductor device according to claim 10, wherein the covering surface of the carrier has a larger area than the lateral surface of the heat sink.

12. The packaged semiconductor device according to claim 1, wherein only one of the lateral surfaces of the heat sink is connected to the electrically insulating carrier.

13. The packaged semiconductor device according to claim 12, wherein an entirety of the only one of the lateral surfaces of the heat sink is connected to the electrically insulating carrier.

14. The packaged semiconductor device according to claim 1, wherein the coefficient of thermal expansion of the top and of the bottom of the heat sink differs from the coefficient of thermal expansion of the die arranged thereon by less than 8%.

15. The packaged semiconductor device according to claim 1, wherein the coefficient of thermal expansion of the top and of the bottom of the heat sink differs from the coefficient of thermal expansion of the die arranged thereon by less than 5%.

16. The packaged semiconductor device according to claim 1, wherein the lateral surfaces are smaller than the top and the bottom of the heat sink.

17. The packaged semiconductor device according to claim 1, wherein a bottom of the first die and a bottom of the second die are at a same potential.

18. A packaged semiconductor device comprising:
a heat sink having a top, a bottom, lateral surfaces that connect the top to the bottom, and, extending within the heat sink, a cooling structure with an inlet line and an outlet line for a cooling medium, the heat sink being formed of an electrically conductive material with a first coefficient of thermal expansion at the top and with a second coefficient of thermal expansion at the bottom;
a first die arranged on the top of the heat sink;
an encapsulating material; and
an electrically insulating carrier,
a second die arranged on the bottom of the heat sink, the first and second die being connected to the heat sink in an electrically conductive manner,
wherein the coefficient of thermal expansion of the top and of the bottom of the heat sink differs from the coefficient of thermal expansion of the die arranged thereon by less than 8%,
wherein the heat sink is attached at one of the lateral surfaces to the electrically insulating carrier, and
wherein the heat sink with the first die and second die is surrounded by the encapsulating material.

* * * * *